(12) United States Patent
Price

(10) Patent No.: US 12,268,014 B2
(45) Date of Patent: Apr. 1, 2025

(54) RESISTORS FOR INTEGRATED CIRCUITS

(71) Applicant: PRAGMATIC SEMICONDUCTOR LIMITED, Cambridge (GB)

(72) Inventor: Richard Price, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 430 days.

(21) Appl. No.: 17/636,108

(22) PCT Filed: Aug. 19, 2020

(86) PCT No.: PCT/GB2020/051989
§ 371 (c)(1),
(2) Date: Feb. 17, 2022

(87) PCT Pub. No.: WO2021/032980
PCT Pub. Date: Feb. 25, 2021

(65) Prior Publication Data
US 2022/0293717 A1 Sep. 15, 2022

(30) Foreign Application Priority Data

Aug. 21, 2019 (GB) .................................... 1912025
Sep. 20, 2019 (GB) .................................... 1913610
Oct. 18, 2019 (GB) .................................... 1915158

(51) Int. Cl.
*H10D 1/47* (2025.01)
*H01C 1/01* (2006.01)
(Continued)

(52) U.S. Cl.
CPC ............ *H10D 1/474* (2025.01); *H01C 1/01* (2013.01); *H01C 1/14* (2013.01); *H01C 7/006* (2013.01);
(Continued)

(58) Field of Classification Search
CPC .............. H01L 28/24; H01C 1/01; H01C 1/14
See application file for complete search history.

(56) References Cited

U.S. PATENT DOCUMENTS 3,996,551 A 12/1976 Croson
4,609,903 A 9/1986 Toyokura et al.
(Continued)

FOREIGN PATENT DOCUMENTS

CN 1359156 A 7/2002
CN 1409400 A 4/2003
(Continued)

OTHER PUBLICATIONS

Notification of First Office Action (Including Translation) for corresponding Chinese Patent Application No. 202080071849.1, mailed May 7, 2024.
(Continued)

*Primary Examiner* — Laura M Menz
(74) *Attorney, Agent, or Firm* — Jason H. Vick; Amped IP LLC

(57) ABSTRACT

A thin-film integrated circuit comprising a first semiconductor device, a second semiconductor device, a first resistor, and a second resistor is provided. A semiconducting region of the first semiconductor device, a resistor body of the first resistor, a semiconducting region of the second semiconductor device, and a resistor body of the second resistor are formed from at least one of a first source material and a second source material, and a material of the resistor body of the first resistor and a material of the resistor body of the second resistor have different electrical properties.

20 Claims, 8 Drawing Sheets

(51) Int. Cl.

| | | |
|---|---|---|
| *H01C 1/14* | (2006.01) | |
| *H01C 7/00* | (2006.01) | |
| *H01C 17/00* | (2006.01) | |
| *H01C 17/075* | (2006.01) | |
| *H01C 17/28* | (2006.01) | |
| *H01L 21/02* | (2006.01) | |
| *H10D 8/60* | (2025.01) | |
| *H10D 30/67* | (2025.01) | |
| *H10D 62/80* | (2025.01) | |
| *H10D 84/00* | (2025.01) | |
| *H10D 84/02* | (2025.01) | |
| *H10D 84/80* | (2025.01) | |
| *H10D 86/01* | (2025.01) | |
| *H10D 86/40* | (2025.01) | |
| *H10D 86/60* | (2025.01) | |
| *H10D 86/80* | (2025.01) | |
| *H10D 99/00* | (2025.01) | |

(52) U.S. Cl.
CPC ......... *H01C 17/003* (2013.01); *H01C 17/075* (2013.01); *H01C 17/28* (2013.01); *H01L 21/02565* (2013.01); *H10D 1/47* (2025.01); *H10D 8/60* (2025.01); *H10D 30/6755* (2025.01); *H10D 30/6757* (2025.01); *H10D 62/80* (2025.01); *H10D 84/02* (2025.01); *H10D 84/204* (2025.01); *H10D 84/811* (2025.01); *H10D 86/0221* (2025.01); *H10D 86/423* (2025.01); *H10D 86/481* (2025.01); *H10D 86/60* (2025.01); *H10D 86/80* (2025.01); *H10D 99/00* (2025.01)

(56) References Cited

U.S. PATENT DOCUMENTS

| | | | |
|---|---|---|---|
| 5,466,484 A | 11/1995 | Spraggins et al. | |
| 5,489,547 A * | 2/1996 | Erdeljac | H01L 21/32155 257/363 |
| 5,872,381 A | 2/1999 | Kato et al. | |
| 5,930,638 A | 7/1999 | Reedy et al. | |
| 6,403,438 B1 | 6/2002 | Santangelo | |
| 7,183,593 B2 * | 2/2007 | Yeo | H01L 27/0629 257/E29.085 |
| 7,633,373 B1 | 12/2009 | Johnson et al. | |
| 8,343,819 B2 * | 1/2013 | Doris | H01L 21/84 257/350 |
| 8,513,723 B2 * | 8/2013 | Booth, Jr. | H01L 28/40 257/350 |
| 9,406,872 B1 | 8/2016 | Annunziata et al. | |
| 10,204,683 B2 | 2/2019 | Price et al. | |
| 11,316,518 B2 * | 4/2022 | De Oliveira | H03K 21/026 |
| 11,575,380 B2 * | 2/2023 | De Oliveira | G06F 1/08 |
| 2001/0041412 A1 | 11/2001 | Takasu | |
| 2002/0084487 A1 | 7/2002 | Takasu | |
| 2002/0084492 A1 | 7/2002 | Osanai et al. | |
| 2003/0047782 A1 | 3/2003 | Hasegawa et al. | |
| 2004/0183130 A1 | 9/2004 | Hara | |
| 2005/0035409 A1 | 2/2005 | Ko et al. | |
| 2005/0074929 A1 | 4/2005 | Hasegawa et al. | |
| 2005/0181589 A1 | 8/2005 | Miyawaki | |
| 2005/0242349 A1 | 11/2005 | Lee et al. | |
| 2005/0253178 A1 | 11/2005 | Yamaguchi et al. | |
| 2006/0091793 A1 | 5/2006 | Baude et al. | |
| 2006/0145296 A1 | 7/2006 | Coolbaugh et al. | |
| 2006/0189049 A1 | 8/2006 | Afentakis et al. | |
| 2006/0249793 A1 | 11/2006 | Beach et al. | |
| 2007/0041141 A1 | 2/2007 | Deng | |
| 2007/0046421 A1 | 3/2007 | Gogineni et al. | |
| 2008/0237800 A1 | 10/2008 | Chinthakindi et al. | |
| 2009/0090977 A1 | 4/2009 | Freeman et al. | |
| 2010/0013026 A1 | 1/2010 | Booth, Jr. et al. | |
| 2010/0079169 A1 | 4/2010 | Kim et al. | |
| 2010/0148168 A1 | 6/2010 | Lai et al. | |
| 2010/0156588 A1 | 6/2010 | Privitera | |
| 2011/0012112 A1 | 1/2011 | Yamazaki et al. | |
| 2011/0012117 A1 | 1/2011 | Yamazaki et al. | |
| 2011/0057918 A1 | 3/2011 | Kimura et al. | |
| 2011/0097860 A1 | 4/2011 | Iida | |
| 2011/0133177 A1 * | 6/2011 | Suzawa | H10B 12/00 438/151 |
| 2011/0169089 A1 * | 7/2011 | Doris | H01L 27/1214 257/350 |
| 2011/0175152 A1 * | 7/2011 | Booth, Jr. | H01L 21/845 257/350 |
| 2012/0098071 A1 | 4/2012 | Aggarwal et al. | |
| 2012/0187493 A1 * | 7/2012 | Doris | H01L 27/1203 257/77 |
| 2013/0092924 A1 | 4/2013 | Sasagawa et al. | |
| 2013/0221346 A1 | 8/2013 | Lu et al. | |
| 2013/0309808 A1 | 11/2013 | Zhang et al. | |
| 2013/0328169 A1 | 12/2013 | Choi | |
| 2014/0027702 A1 | 1/2014 | Lu et al. | |
| 2014/0306219 A1 | 10/2014 | Yamazaki et al. | |
| 2015/0155313 A1 | 6/2015 | Yamazaki et al. | |
| 2015/0162396 A1 | 6/2015 | Yagi et al. | |
| 2015/0187878 A1 | 7/2015 | Yamazaki et al. | |
| 2015/0294984 A1 * | 10/2015 | Cheng | H01L 21/7624 438/151 |
| 2015/0318340 A1 | 11/2015 | Dirnecker | |
| 2016/0093638 A1 * | 3/2016 | Cheng | H01L 21/26513 438/151 |
| 2016/0123817 A1 | 5/2016 | Bennett et al. | |
| 2016/0141312 A1 | 5/2016 | Nakatani et al. | |
| 2016/0163738 A1 | 6/2016 | Sato | |
| 2016/0233338 A1 | 8/2016 | Lu et al. | |
| 2016/0329392 A1 | 11/2016 | Miyake | |
| 2017/0125604 A1 | 5/2017 | Oshima | |
| 2017/0162646 A1 | 6/2017 | Lee et al. | |
| 2017/0301796 A1 | 10/2017 | Ishihara et al. | |
| 2018/0019297 A1 | 1/2018 | Dirnecker et al. | |
| 2018/0046004 A1 | 2/2018 | Yamazaki et al. | |
| 2018/0261664 A1 | 9/2018 | Direcker et al. | |
| 2018/0337288 A1 | 11/2018 | Shin | |
| 2019/0019859 A1 | 1/2019 | Daigle et al. | |
| 2019/0148361 A1 | 5/2019 | Lu et al. | |
| 2019/0221516 A1 | 7/2019 | Kande et al. | |
| 2019/0346500 A1 * | 11/2019 | Ren | H01L 22/14 |
| 2020/0135445 A1 | 4/2020 | Yamazaki et al. | |
| 2021/0226629 A1 * | 7/2021 | De Oliveira | H03K 19/20 |
| 2022/0216871 A1 * | 7/2022 | De Oliveira | H04B 5/79 |
| 2022/0293308 A1 * | 9/2022 | Price | H01L 27/1255 |
| 2022/0293591 A1 * | 9/2022 | Price | H01C 17/28 |
| 2022/0293717 A1 * | 9/2022 | Price | H01C 7/006 |
| 2022/0293797 A1 * | 9/2022 | Price | H01L 29/24 |
| 2022/0359578 A1 * | 11/2022 | Price | H01L 29/78648 |
| 2023/0238377 A1 * | 7/2023 | Price | H01L 27/13 257/379 |

FOREIGN PATENT DOCUMENTS

| | | | | |
|---|---|---|---|---|
| CN | 1722448 A | | 1/2006 | |
| CN | 102576732 A | | 7/2012 | |
| CN | 103311128 A | | 9/2013 | |
| CN | 106463507 A | | 2/2017 | |
| CN | 107305843 A | | 10/2017 | |
| CN | 109786365 A | | 5/2019 | |
| CN | 114556495 A | * | 5/2022 | ........... G03F 7/0035 |
| CN | 114556603 A | * | 5/2022 | ........... G03F 7/0035 |
| CN | 114600234 A | * | 6/2022 | ............... H01C 1/01 |
| DE | 102020000633 A1 | * | 9/2020 | ............. H01L 21/76 |
| EP | 1063630 A2 | | 12/2000 | |
| EP | 2202802 A1 | | 6/2010 | |
| EP | 3236503 A1 | | 10/2017 | |
| EP | 2979302 B1 | | 12/2020 | |
| EP | 4018477 A1 | * | 6/2022 | ............... H01C 1/01 |
| EP | 4018478 A1 | * | 6/2022 | ........... G03F 7/0035 |
| EP | 4018490 A1 | * | 6/2022 | ........... G03F 7/0035 |
| EP | 4018491 A1 | * | 6/2022 | ........... G03F 7/0035 |
| GB | 727505 A | | 4/1955 | |
| GB | 2490752 A | * | 11/2012 | ............. H01L 21/027 |

(56) References Cited

FOREIGN PATENT DOCUMENTS

| | | | | |
|---|---|---|---|---|
| GB | 2525184 | A | 10/2015 | |
| GB | 2561004 | A | 10/2018 | |
| GB | 2570569 | A * | 7/2019 | ........ H01L 27/0629 |
| GB | 2586520 | A * | 2/2021 | ........... G03F 7/0035 |
| GB | 2586522 | A * | 2/2021 | ........... G03F 7/0035 |
| GB | 2587793 | A * | 4/2021 | ............... H01C 1/01 |
| GB | 2589937 | A * | 6/2021 | ............... H01C 1/01 |
| GB | 2586520 | A9 * | 10/2021 | ........... G03F 7/0035 |
| GB | 2598074 | A * | 2/2022 | ........... G03F 7/0035 |
| GB | 2602408 | A * | 6/2022 | ........ H01L 27/0629 |
| GB | 2610886 | A * | 3/2023 | ........... G03F 7/0035 |
| JP | S 60-94757 | A | 5/1985 | |
| JP | 2003-007847 | A | 1/2003 | |
| JP | 2002-124641 | A | 4/2004 | |
| JP | 2008-124188 | A | 5/2008 | |
| JP | 2010-087518 | A | 4/2010 | |
| JP | 2010-225725 | A | 10/2010 | |
| JP | 2011-077106 | A | 4/2011 | |
| JP | 2018-006412 | A | 1/2018 | |
| JP | 2018-137423 | A | 8/2018 | |
| WO | WO 89/03121 | A1 | 4/1989 | |
| WO | WO 93/07629 | A | 4/1993 | |
| WO | WO 2012/071878 | A1 | 6/2012 | |
| WO | WO 2015/079362 | A1 | 6/2015 | |
| WO | WO 2015/097597 | A1 | 7/2015 | |
| WO | WO 2018/004672 | A1 | 1/2018 | |
| WO | WO 2018/197988 | A1 | 11/2018 | |
| WO | WO 2019/116020 | A1 | 6/2019 | |
| WO | WO-2021032977 | A1 * | 2/2021 | ............... H01C 1/01 |
| WO | WO-2021032978 | A1 * | 2/2021 | ............... H01C 1/01 |
| WO | WO-2021032979 | A1 * | 2/2021 | ........... G03F 7/0035 |
| WO | WO-2021032980 | A1 * | 2/2021 | ........... G03F 7/0035 |
| WO | WO-2021032981 | A1 * | 2/2021 | ........... G03F 7/0035 |

OTHER PUBLICATIONS

Office Action for U.S. Appl. No. 17/636,113, mailed Jun. 20, 2024.
Notification of First Office Action (Including Translation) for corresponding Chinese Patent Application No. 202080071825.6, mailed Dec. 27, 2023.
Office Action (Restriction Requirement) for U.S. Appl. No. 17/636,099, mailed Dec. 29, 2023.
International Preliminary Report on Patentability for International Application No. PCT/GB2020/051987, mailed Mar. 3, 2022.
International Preliminary Report on Patentability for International Application No. PCT/GB2020/051986, mailed Mar. 3, 2022.
International Preliminary Report on Patentability for International Application No. PCT/GB2020/051988, mailed Mar. 3, 2022.
International Preliminary Report on Patentability for International Application No. PCT/GB2020/051989, mailed Mar. 3, 2022.
International Preliminary Report on Patentability for International Application No. PCT/GB2020/051990, mailed Mar. 3, 2022.
U.S. Appl. No. 17/636,083, filed Feb. 17, 2022, Price et al.
U.S. Appl. No. 17/636,090, filed Feb. 17, 2022, Price et al.
U.S. Appl. No. 17/636,099, filed Feb. 17, 2022, Price.
U.S. Appl. No. 17/636,113, filed Feb. 17, 2022, Price.
Kawakita, Masatoshi et al. "Laterally Configured Resistive Switching Device Based on Transition-Metal Nano-Gap Electrode on Gd Oxide" Applied Physics Letters 108, 023101 (2016).
Mack, Chris A. "Seeing Double" IEEE Spectrum; Nov. 1, 2008.
Nayak, Pradipta K. et al. "Thin Film Complementary Metal Oxide Semiconductor (CMOS) Device Using a Single-Step Deposition of the Channel Layer" Scientific Reports; 4: 4672; Apr. 14, 2014.
International Search Report for International Application No. PCT/GB2020/051987, mailed Nov. 26, 2020.
Written Opinion for International Application No. PCT/GB2020/051987, mailed Nov. 26, 2020.
Invitation to Pay Additional Fees and, Where Applicable, Protest Fee for International Application No. PCT/GB2020/051986, mailed Nov. 5, 2020.
International Search Report for International Application No. PCT/GB2020/051986, mailed Jan. 13, 2021.
Written Opinion for International Application No. PCT/GB2020/051986, mailed Jan. 13, 2021.
International Search Report for International Application No. PCT/GB2020/051988, mailed Nov. 2, 2020.
Written Opinion for International Application No. PCT/GB2020/051988, mailed Nov. 2, 2020.
Invitation to Pay Additional Fees and, Where Applicable, Protest Fee for International Application No. PCT/GB2020/051989, mailed Nov. 25, 2020.
International Search Report for International Application No. PCT/GB2020/051989, mailed Feb. 8, 2021.
Written Opinion for International Application No. PCT/GB2020/051989, mailed Feb. 8, 2021.
Invitation to Pay Additional Fees and, Where Applicable, Protest Fee for International Application No. PCT/GB2020/051990, mailed Nov. 2, 2020.
International Search Report for International Application No. PCT/GB2020/051990, mailed Dec. 23, 2020.
Written Opinion for International Application No. PCT/GB2020/051990, mailed Dec. 23, 2020.
Combined Search and Examination Report Under Sections 17 and 18(3) for Great Britain Application No. 1912025.2, mailed Jan. 28, 2020.
Examination Report Under Section 18(3) for Great Britain Application No. 1912025.2, mailed Jan. 17, 2022.
Search Report Under Section 17(5) for Great Britain Application No. 2000887.6 mailed Jul. 22, 2020.
Search Report Under Section 17(6) for Great Britain Application No. 2000887.6 mailed Mar. 3, 2021.
Combined Search and Examination Report Under Sections 17 and 18(3) for Great Britain Application No. 1913610.0, mailed Mar. 11, 2020.
Examination Report Under Section 18(3) for Great Britain Application No. 1913610.0, mailed Sep. 10, 2021.
Combined Search and Examination Report Under Sections 17 and 18(3) for Great Britain Application No. GB 1915158.8, mailed Apr. 20, 2020.
Combined Search and Examination Report Under Sections 17 and 18(3) for Great Britain Application No. 1917079.4, mailed May 7, 2020.
Search Report Under Section 17(6) for Great Britain Application No. 1917079.4, mailed Mar. 22, 2021.
Examination Report Under Section 18(3) for Great Britain Application No. 1917079.4, mailed Aug. 25, 2021.
Combined Search and Examination Report Under Sections 17 and 18(3) for Great Britain Application No. 2117276.2, mailed Dec. 14, 2021.
Combined Search and Examination Report Under Sections 17 and 18(3), for corresponding Great Britain Application No. 2202910.2, mailed Apr. 5, 2022.
Klibanov, Lev "Integrated Resistors for an Advanced Node CMOS" EE Times; Nov. 16, 2016.
Wikipedia "Multiple Patterning" Available at https://en.wikipedia.org/w/index.php?title=Multiple_patterning&oldid=914700788; Sep. 8, 2019.
Examination Report Under Section 18(3) for Great Britain Application No. 2000887.6 mailed Mar. 27, 2023.
Office Action (Restriction Requirement) for U.S. Appl. No. 17/636,083, mailed Mar. 6, 2024.
Office Action for U.S. Appl. No. 17/636,099, mailed Feb. 29, 2024.
Office Action for corresponding European Patent Application No. 20764719.9, mailed Jun. 25, 2024.
Office Action for corresponding European Patent Application No. 20764722.3, mailed Jun. 7, 2024.
Notification of Second Office Action (Including Translation) for corresponding Chinese Patent Application No. 202080071825.6, mailed Jul. 15, 2024.
Office Action for U.S. Appl. No. 17/636,083, mailed Aug. 9, 2024.
Notice of Allowance for U.S. Appl. No. 17/636,099, mailed Jul. 31, 2024.
U.S. Appl. No. 18/931,684, filed Oct. 30, 2024.

(56) References Cited

OTHER PUBLICATIONS

Notification of First Office Action (Including Translation) for corresponding Chinese Patent Application No. 202080073505.4, mailed Dec. 26, 2024.
Notification of Second Office Action (Including Translation) for corresponding Chinese Patent Application No. 202080071849.1, mailed Oct. 30, 2024.
Office Action (Restriction Requirement) for U.S. Appl. No. 17/636,090 mailed Dec. 23, 2024.

* cited by examiner

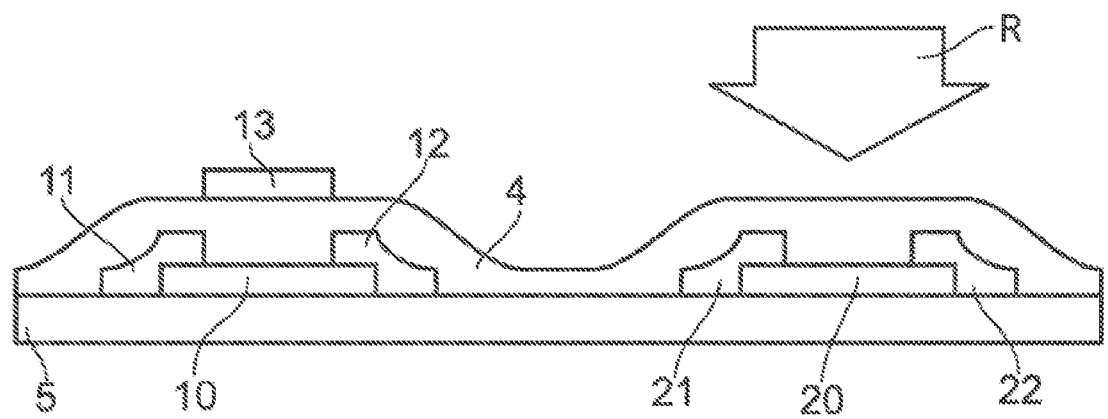
FIG. 4
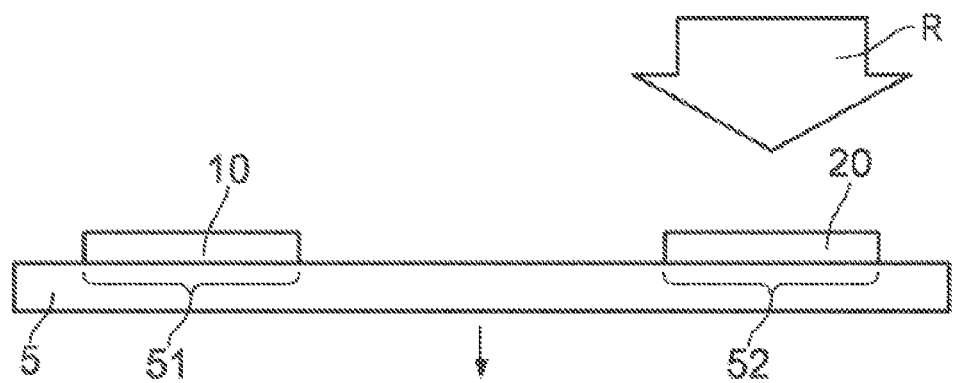
FIG. 5A
FIG. 5B
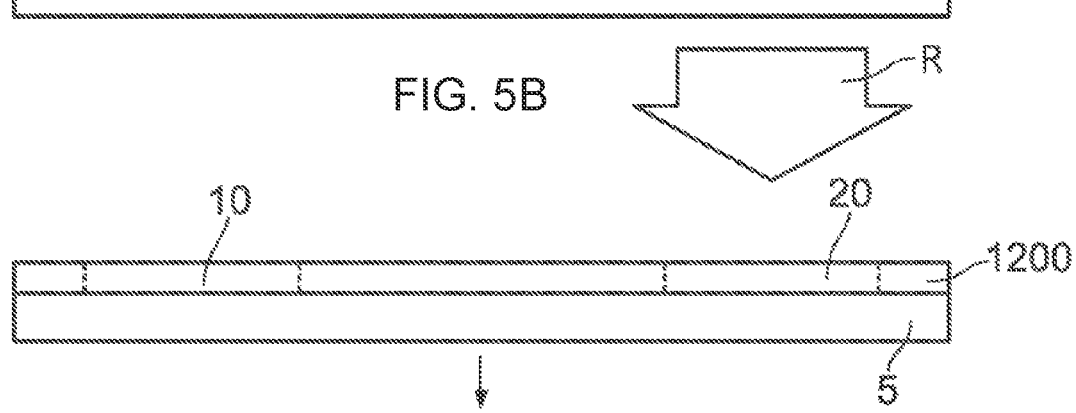
FIG. 6A
FIG. 6B

RESISTORS FOR INTEGRATED CIRCUITS

CROSS-REFERENCE TO RELATED APPLICATIONS

This application is a national stage application under 35 U.S.C. 371 of PCT Application No. PCT/GB2020/051989, having an international filing date of 19 Aug. 2020, which designated the United States, which PCT application claimed the benefit of Great Britain Application No. 1912025.2, filed 21 Aug. 2019, Great Britain Application No. 1913610.0, filed 20 Sep. 2019, and Great Britain Application No. 1915158.8, filed 18 Oct. 2019, each of which are incorporated herein by reference in their entirety.

FIELD OF THE DISCLOSURE

The present disclosure relates to thin-film integrated circuits and methods for fabricating thin-film integrated circuits.

BACKGROUND OF THE DISCLOSURE

Resistors for integrated circuits (ICs) may be provided using a number of different structures and materials, which each variation of resistor potentially providing a different range of resistances. However, when considering resistors for thin-film ICs, the range of resistances that may be provided is more limited due to the restriction to using thin-film materials to provide the resistor body of a resistor and also the restriction in the structures that may be used for the resistors. For example, the values of resistor that may be provided are generally limited by the electrical properties of the materials that may be used to form the thin-film layers of the thin-film IC.

More specifically, since a thin-film IC resistor is usually planar in form it is conventional to describe its resistivity in terms of sheet resistance, or resistance per square ($\Omega/\square$). Typical values are between 10 and 150$\Omega/\square$, and a resistor having a particular resistance is formed by selecting its width and length in this sheet material. The constraints of patterning resolution, resistor film thickness range, resistance tolerances, and limited available IC area may result in a compromise in the range of resistors that can be provided in a thin-film IC. This may constrain circuit designs, for example by excluding IC designs of economically viable footprint that incorporate both resistances of the order hundreds of ohms ($\sim 10^2 \Omega$) and resistances of the order millions of ohms ($\sim 10^6 \Omega$, or M$\Omega$).

Consequently, there is a need for an approach to efficiently provide an increased range of resistor values in a thin-film IC.

BRIEF SUMMARY OF THE DISCLOSURE

According to a first aspect of the present disclosure, there is provided a thin-film integrated circuit comprising a first semiconductor device, a second semiconductor device, a first resistor, and a second resistor, wherein a semiconducting region of the first semiconductor device, a resistor body of the first resistor, a semiconducting region of the second semiconductor device, and a resistor body of the second resistor are formed from at least one of a first source material and a second source material, and wherein a material of the resistor body of the first resistor and a material of the resistor body of the second resistor have different electrical properties.

Among other advantages, by utilising shared source materials to form semiconductor devices, and resistors with different electrical properties, an increased range of resistor values may be provided in a thin-film integrated circuit whilst potentially providing improved scaling of resistor footprints and values, and lessening any increases in fabrication complexity.

In one example, the semiconducting region of the first semiconductor device and the resistor body of the first resistor are formed from the first source material, and the semiconducting region of the second semiconductor device and the resistor body of the second resistor are formed from the second source material.

In another example, at least one of the resistor body of the first resistor and the semiconducting region of the first semiconductor device, and the second material that forms the resistor body of the second resistor and the semiconducting region of the second semiconductor device are included in a single deposition layer.

In another example, the first semiconductor device is a first thin-film transistor, TFT, and the resistor body of the first resistor and the channel of the first TFT are formed from the first source material, and the second semiconductor device is a second thin-film transistor, TFT, and the resistor body of the second resistor and the channel of the second TFT are formed from the second source material.

In another example, the first semiconductor device is a first thin-film transistor, TFT, and the resistor body of the first resistor and the channel of the first TFT are formed from the first source material, and the second semiconductor device is a Schottky diode and the resistor body of the second resistor and a semiconducting region of the Schottky diode are formed from the second source material.

In another example, a material of the semiconducting region of the first semiconductor device and the material of the resistor body of the first resistor have different electrical properties.

In another example, the first source material and the second source material are semiconductors.

In another example, the first source material is an n-type semiconductor and the second source material is a p-type semiconductor.

In another example, the first and second source materials are the same or different.

In another example, the first and second source materials are an intrinsic semiconductor.

In another example, the first TFT is an n-type TFT (e.g. nMOS) and the second TFT is a p-type TFT (e.g. pMOS).

In another aspect of the present disclosure, there is provided a method for fabricating a thin-film integrated circuit, IC, the thin-film IC comprising a first semiconductor device, a second semiconductor device, a first resistor, and a second resistor, and the method comprising depositing at least one of a first source material and a second source material to form a semiconducting region of the first semiconductor device, a resistor body of the first resistor, a semiconducting region of the second semiconductor device, and a resistor body of the second resistor, and altering the electrical properties of at least one portion of the source material forming the semiconducting region of the first semiconductor device, the resistor body of the first resistor, the semiconducting region of the second semiconductor device, and the resistor body of the second resistor during or after deposition of the respective portion of source material, wherein the disposed material of the resistor body of the first resistor and the disposed material of the resistor body of the second resistor have different electrical properties.

In one example, the depositing at least one of a first source material and a second source material comprises depositing a layer of the first source material to form the semiconducting region of the first semiconductor device and the resistor body of the first resistor, and depositing a layer of the second source material to form the semiconducting region of the second semiconductor device and the resistor body of the second resistor.

In another example, altering the electrical properties comprises at least one of controlling the environmental conditions under which the respective portion of the source material is deposited, depositing a further material onto the respective portion of source material, exposing the respective portion of the source material to electromagnetic radiation, and controlling the electrical properties of a surface onto which the respective portion of source material is deposited.

In another example, altering the electrical properties of a portion of the source material includes one or more of changing the source material of the portion from an n-type semiconductor to a p-type semiconductor, changing the source material of the portion from a p-type semiconductor to an n-type semiconductor, changing the source material of the portion from an intrinsic semiconductor to an n-type or a p-type semiconductor, and changing the source material of the portion from a semiconductor to a conductor.

In another example, the first semiconductor device is a first thin-film transistor, TFT, and the resistor body of the first resistor and the channel of the first TFT are formed from the first source material, and the second semiconductor device is a second thin-film transistor, TFT, and the resistor body of the second resistor and the channel of the second TFT are formed from the second source material.

In another example, the first semiconductor device is a first thin-film transistor, TFT, and the resistor body of the first resistor and the channel of the first TFT are formed from the first source material, and the second semiconductor device is a Schottky diode and the resistor body of the second resistor and a semiconducting region of the Schottky diode are formed from the second source material.

In another example, the material of the semiconducting region of the first semiconductor device and the material of the resistor body of the first resistor have different electrical properties.

In another example, the first source material and the second source material are semiconductors.

In another example, the first source material is an n-type semiconductor and the second source material is a p-type semiconductor.

In another example, the first and second source materials are the same or different.

In another example, the first and second source materials are an intrinsic semiconductor.

In another example, the first TFT is an n-type TFT (e.g. nMOS) and the second TFT is a p-type TFT (e.g. pMOS).

In another example, there is a difference of at least an order of magnitude between the resistivity the material of the resistor body of the first resistor and the resistivity of the material of the resistor body of the second resistor.

In another example, the first and second source materials are metal oxides.

BRIEF DESCRIPTION OF THE DRAWINGS

Embodiments of the present disclosure are further described hereinafter with reference to the accompanying drawings, in which:

FIG. 4 provides a schematic diagram of an example TFT/resistor pair for a thin-film IC;

FIGS. 5a-5b provide an example approach to altering the electrical properties of a metal oxide film layer used to form a TFT/resistor pair for a thin-film IC;

FIG. 6a-6b provide an example approach to altering the electrical properties of a metal oxide film layer used to form a TFT/resistor pair for a thin-film IC;

DETAILED DESCRIPTION

Figure 1:
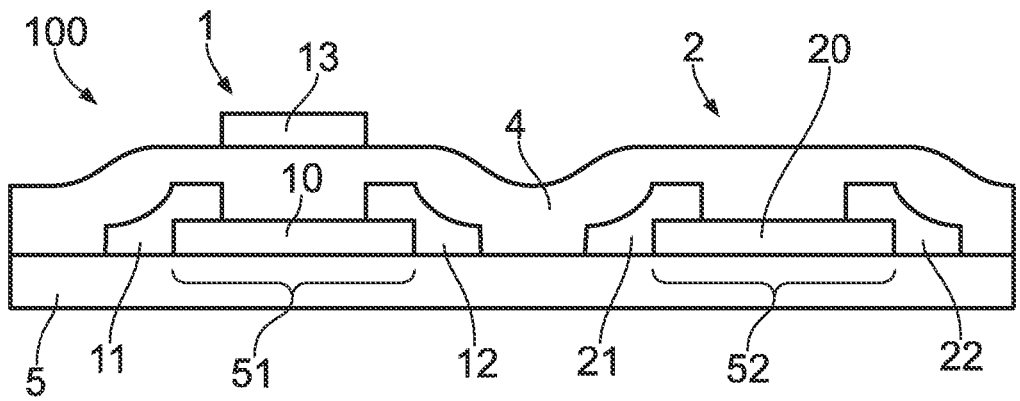
FIG. 1 provides a schematic diagram of an example thin-film transistor (TFT)/resistor pair for a thin-film IC.

Alternative ranges of resistances in a thin-film IC may be provided via the use of semiconductor-based resistors. For example, with respect to metal oxide semiconductors (MOS), such materials may be used to form both n-type (e.g. ZnO, SnO2, InGaZnO, InSnO) and p-type (e.g. ZnO, SnO, NiO, CuMO2) materials. The specific characteristics of the thin-film material may be dependent upon the processing that is applied to the thin-film material, for example, materials such as ZnO can be n-type, p-type or conductive, depending on their process of manufacture, and thus may be used to construct resistors in a thin-film IC. Further examples of such materials are the fullerenes graphene and carbon nanotubes, and 2D materials such as molybdenum disulphide, tellurides and selenides.

However, even when using the same material to form semiconducting and resistor components in thin-film ICs, the range of resistances that can be achieved may be limited. Consequently, the problem remains that the range of resistances that may be achieved within a thin-film IC using conventional approaches to providing resistors are limited.

In accordance with the present disclosure, an increased range of resistor values may be realised in a thin-film IC via the use of two or more resistor types/technologies (i.e. differing structures and/or materials). For example, a first type of resistor may be used to provide a resistance within a low range and a second type of resistor may be used to provide a resistance in a relatively higher range. Additionally, by utilising different resistor types within a single thin-film IC, the size (i.e. footprint) of the resistor may scale more linearly with respect to the value of the resistor given the potential restrictions of the minimum feature size of the thin-film IC, thus leading to the more efficient use of space within the thin-film IC. Furthermore, the use of different resistor types within a thin-film IC may also lead to advantages in terms of one or more of required feature size/patterning resolution, resistance tolerances, and thin-film thickness.

However, although the range of resistances may be increased, the provision of additional materials within a thin-film IC may lead to additional fabrication complexity in terms of additional deposition and etching steps for example. Consequently, reduced complexity approaches to the provision of different types of resistor in a thin-film IC is also desirable.

In order to reduce the complexity associated with the provision of multiple resistor types in a thin-film IC, in accordance with the present disclosure, a same or corresponding material may be used to form the resistive/resistor bodies of the resistors and also the channel of one or more thin-film transistors (TFTs) included in the thin-film IC, thus enabling the range of materials required to provide an increased range of resistances to be reduced, and/or the material forming the resistor body and channel of the TFT to be deposited in a single deposition step. Throughout this disclosure it should be noted that reference to a same or corresponding material encompasses a range of variations, for example the source material for forming a deposition layer may initially be identical but during or after deposition one or more portions of the layer of source material may have their electrical properties altered such that the layer may then be considered to be formed from corresponding materials. For example, processing including doping, annealing, exposure to electromagnetic radiation may selectively be applied to a layer or layers of identical material in order to alter the electrical properties of one or more portions of the layer(s) of source material so that the material of the final fabricated component is no longer identical to the source material and may have different electrical properties to materials of other components formed from the same source material.

The various structures and fabrication techniques used to form thin-film ICs that include a range of different resistor types in an efficient manner are described below with reference to FIGS. 1 to 10.

FIGS. 1 to 6 describe various approaches to realising TFT/resistors pairs in a thin-film IC where the channel and resistor body are formed from a same source material but where the channel and resistor body have different electrical properties. Although FIGS. 1 to 6 relate to a TFT/resistor pair FIGS. 7 to 10 relate to the use of such a pair in achieving a thin-film that includes in an efficient manner an increased range of resistor values.

FIG. 1 illustrates a TFT/resistor pair 100 including a TFT 1 and a resistor 2 that may be included in a thin-film IC. The TFT 1 is a field effect transistor, FET, comprising a source terminal 11, a drain terminal 12, a gate terminal 13, and a channel 10 providing a controllable semi-conductive channel between the source and drain terminals. As will be well appreciated, the conductivity of the channel is controlled by application of suitable voltages to the gate terminal 13. The resistor 2 comprises a first resistor terminal 21, a second resistor terminal 22, and a resistor body 20 providing a resistive current path between the first resistor terminal and the second resistor terminal. Although the source and drain terminals 11, 12 and resistor terminals 21, 22 are shown in the 'top contact' architecture in this embodiment, i.e. partly overlying the end portions of the first body 10 and resistor body 20, other examples may include circuits employing alternative terminal architectures. Furthermore, although the TFT shown is of the 'top gate' architecture, with the gate terminal 13 positioned above the first body 10, other embodiments of the invention include circuits employing alternative TFT architectures.

The channel 10 comprises a first portion of a material such as a metal oxide, and the resistor body 20 comprises a second portion of the same metal oxide. Thus, the TFT/resistor pair comprise a semiconductor channel and a resistor body each formed from a portion of the same metal oxide. This may enable cost and/or time savings during manufacture, as the number of materials and methods used to form, pattern and define transistor pair and/or thin-film IC may be reduced. The first portion of metal oxide, forming the channel 10, has been formed on a first region 51 of a substrate 5 which supports at least the TFT and resistor. The channel 10 can thus be regarded as having been formed on or over a first region of a surface of the substrate 5. The second portion of the metal oxide has been formed over a second region 52 of the substrate surface. FIG. 1 also illustrates a layer or body of dielectric material 4 which has been formed over the channel 10 and resistor body 20, the source and drain terminals and the resistor terminals, and which provides the gate dielectric of the TFT 1. The gate terminal 13 has then been formed over the layer of dielectric material 4.

Although FIG. 1 shows the channel 10 and resistor body 20, each comprising the same metal oxide, as set out above, the two portions of metal oxide material have different electrical properties. For example, the two portions of metal oxide may have been deposited using a same source metal oxide material but under different conditions such that the portion forming the channel 10 exhibits substantially semi-conductive behaviour, whereas the portion forming the resistor body 20 exhibits substantially resistive behaviour. It will be appreciated that this difference in electrical/electronic properties can be achieved in a number of ways. For example, one of the portions of metal oxide material may be deposited using a physical vapour deposition (PVD) or chemical vapour deposition (CVD) technique in the presence of a first concentration of oxygen, whereas the other may be deposited by PVD/CVD in the presence of a second concentration of oxygen. Alternatively or additionally, the different electrical/electronic properties of the portions forming the channel and resistor body may be achieved by processing the portions differently, after their initial formation/deposition stage, thus enabling a single deposition step to be used. A further alternative or additional route to differentiating the electrical/electronic properties of the portions forming the channel and resistor body is by preparing the first region 51 of the substrate surface differently from the second region 52 of the substrate surface, prior to deposition of one or both portions, and/or by providing differences between the layer of dielectric material 4 formed over the channel and that formed over the resistor.

Figure 2:
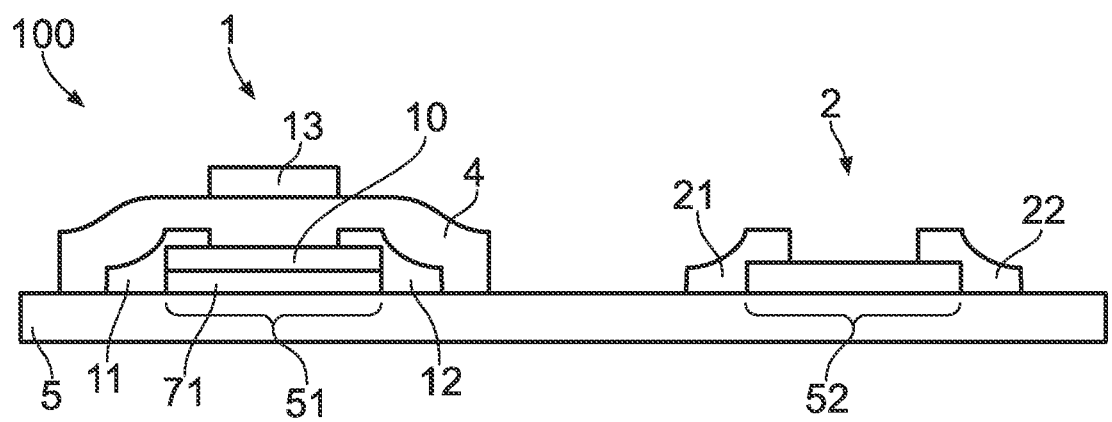
FIG. 2 provides a schematic diagram of a TFT/resistor pair for a thin-film IC.

FIG. 2 illustrates a TFT/resistor pair where the difference in electrical properties of the channel and resistor body has been achieved, at least in part, by depositing the portion of metal oxide material forming the channel on a source of a first dopant 71 which has been formed on a first region 51 of the substrate 5. The source of dopant 71 is arranged such that the portion of metal oxide material forming the channel may be deposited as a resistive layer, with the pre-patterned dopant selectively causing the resistive layer deposited on top of it to become semi-conductive. The portion of metal oxide material forming the resistor body has been deposited as a resistive layer on a second region 52 of the substrate 5 where no dopant source is present. Thus, the portion of the metal oxide material forming the resistor body remains resistive, rather than being converted to semi-conductive. This approach therefore allows a single deposition step for the metal oxide material but whose electrical properties of particular portions is altered after deposition dependent upon the doping applied to the substrate or a further material that neighbours the portion of the metal oxide, for example the dielectric layer 4.

Figure 3:
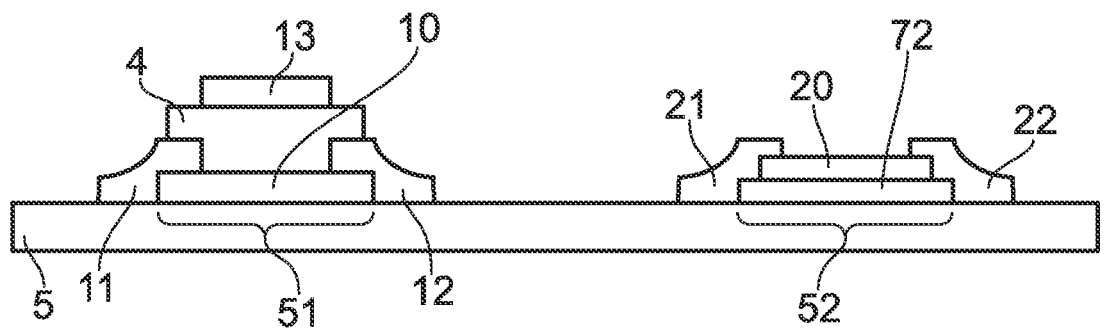
FIG. 3 provides a schematic diagram of an example TFT/resistor pair for a thin-film IC.

FIG. 3 shows an alternative implementation of a TFT/resistor pair in which a source of a second dopant 72 has been selectively provided over a second region 52 of the substrate 5. The portions of metal oxide material forming the channel and the resistor body have each been deposited initially as semi-conductive layers. However, the source of the second dopant 72 has been selected such that the dopant interacts with the portion of the metal oxide forming the resistor body to change its electrical properties from substantially semi-conductive to substantially resistive, and so results in the portion of the metal oxide forming the resistor body being resistive, whereas the portion of the metal oxide forming the channel of the TFT remains semi-conductive.

Although the examples discussed above in reference to FIGS. 2 and 3 comprise a source of dopant 71, 72 beneath the channel or resistor body, a source of dopant may instead, or additionally, be provided above or to the side of one or both of those bodies. For example, a dielectric layer 4 may be a source of dopant, and/or the source and drain terminals 11, 12 and/or resistor terminals 21, 22 may be a source of dopant. The source of dopant may remain in the final circuit structure or it may be removed during processing. For example, a conductive layer used to form the source and drain terminals 11, 12 and/or resistor terminals 21, 22 may be a source of dopant, and doping of the metal oxide portions forming the channel and resistor body may be achieved prior to partial removal of the conductive layer during formation of the terminals, for example by patterning and etching.

It will be appreciated that whilst selective doping of the deposited quantities of metal oxide material may be used to achieve their different electrical properties, this technique may also be used in conjunction with depositing the first and second portions of materials forming the channel and resistor body under different conditions. However, the material forming the channel and resistor body may be deposited under the same conditions, and their different electrical properties may be achieved wholly by their different subsequent processing.

FIG. 4 illustrates part of an alternative approach to the formation of a TFT/resistor pair in a thin-film IC. Here, the TFT channel and the resistor have been formed, initially by depositing the quantities of metal oxide material on respective portions of a surface of the substrate 5, possibly as a single layer of metal oxide. These portions are initially semi-conductive. However, the step illustrated in FIG. 4 is one in which the portion of material forming the resistor body is selectively exposed to electromagnetic radiation so as to increase its electrical conductivity such that it provides a resistive, rather than semi-conductive, path between the terminals of the resistor. It will be appreciated that this selective exposure of just one of the portions of metal oxide material may be achieved in a variety of ways. For example, radiation may be directed on to a wide portion of the circuit, with the gate terminal 13 acting as a mask to shield the channel of metal oxide material or at least a substantial part of it from the effects of the radiation. Alternatively, a separate mask may be used, and/or a source of electromagnetic radiation may be used which is able to illuminate just a small part of the circuit, including the resistor (for example a laser beam may be used to perform the selective annealing/processing). Techniques suitable for use in certain embodiments, to increase the conductivity of one or more of the bodies, are described in GB2525184A.

FIG. 5 illustrates part of another alternative approach to the formation of a TFT/resistor pair in a thin-film IC. In this method, portions of metal oxide material forming the channel and the resistor body have been deposited on separate regions of the substrate 5, and initially both are semi-conductive. It will be appreciated that the separate portions of metal oxide material shown in FIG. 5a may be produced by first depositing a uniform layer, sheet, or other structure of metal oxide material, and then patterning it by any suitable means. Alternatively, the portions of metal oxide material may be selectively formed by any suitable technique on the substrates surface (for example by selective deposition, coating, printing, or otherwise). In the step illustrated in FIG. 5a, the portion of metal oxide material forming the resistor body is being selectively exposed to electromagnetic radiation so as to increase its conductivity, and change its electrical properties from being substantially semi-conductive to being resistive. After this exposure, which can generally be regarded as processing the portion of metal oxide material forming the resistor body differently from the portion forming the TFT channel, we have the structure shown in FIG. 5b, where the channel of the TFT of the metal oxide occupies one region of the substrate surface, and the portion of the substantially resistive metal oxide material forming the resistor body occupies another portion. It will be appreciated that the terminal/contacts of the transistor and resistor may then be built up by suitable processing techniques, and the gate dielectric and gate terminal can also be formed. Thus, the method illustrated in FIG. 5 is one in which the portions of metal oxide material that form the TFT channel and the resistor body are formed from a same deposition layer of source material and are processed differently before the remainder of the transistor and resistor are formed (in contrast to the method illustrated in FIG. 6, where that different processing is performed prior to the patterning of the transistor and resistor structures).

FIG. 6 illustrates part of yet another approach to the formation of a TFT/resistor pair in a thin-film IC, where the material used to form the TFT channel and the resistor body may be deposited as a single layer of a source material. Initially a uniform layer of semi-conductive material 1200 has been formed to cover an open surface of the substrate 5. Separate portions of that layer 1200 provide the metal oxide material used to form the TFT channel and the resistor body. FIG. 6a also illustrates that the portion of metal oxide forming the resistor body is being selectively exposed to electro-magnetic radiation to increase its conductivity, and hence decrease its resistivity. It will be appreciated that this selective exposure may be performed by a variety of suitable techniques, as will be apparent to the skilled person from their general knowledge in this field, as well as from the remainder of this disclosure. Thus, in this example the selective processing of the portion of metal oxide forming the resistor body is performed before the layer 1200 is patterned. FIG. 6b shows the structure resulting from patterning the layer 1200, by selectively removing portions of it to expose underlying regions of the substrate 5 surface. In particular, metal oxide material has been removed to leave just the portions forming the TFT channel and the resistor body. The subsequent structures such as terminals and dielectric layers may then be formed in any suitable manner, such as that described above.

Resistors having resistances that differ by many orders of magnitude are often required in a typical IC. For example, low power dissipation biasing networks (such as voltage dividers) and low frequency oscillators may be efficiently implemented using very high value resistors, whilst for pull-up/pull-down functions in logic gates and for low frequency oscillators, much lower value resistors are preferred.

Figure 7:
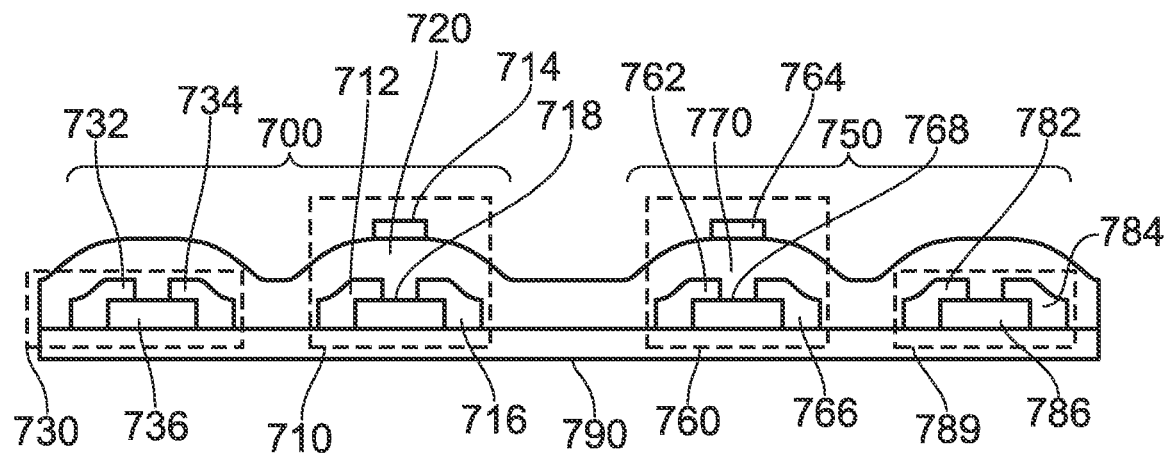
FIG. 7 provides a schematic diagram of two TFT/resistors pairs for providing an increased range of resistor values in a thin-film IC.

FIG. 7 illustrates an example structure that may be included in a thin-film IC where an increased range of resistances are provided compared to conventional structures. More specifically, a first TFT/resistor pair 700 and a second TFT/resistor pair 750 are provided, where the first TFT/resistor pair 700 is formed from a first TFT 710 and a first resistor 730, and the second TFT/resistor pair 750 is formed from a first TFT 760 and a first resistor 780. Each of the first and second TFT/resistor pairs 700, 750 may have a similar geometry to that set out with respect to FIGS. 1 to 3 and thus may each be fabricated in a similar manner to those of FIGS. 1 to 6; however, they are not limited to such techniques.

The first TFT 710 includes a source terminal 712, a gate terminal 714, a drain terminal 716, a channel 718 and a dielectric layer 720. The first resistor 730 comprises a first terminal 732, a second terminal 734, and resistor body 736. The second TFT 760 includes a source terminal 762, a gate terminal 764, a drain terminal 766, a channel 768 and a dielectric layer 770. The second resistor 780 comprises a first terminal 782, a second terminal 784, and resistor body 786, and the first and second TFT/resistor pairs 700, 750 may be formed on a substrate 790. As set out above with respect to FIG. 1, the interconnects between the illustrated devices and also other devices of the thin-film IC are not shown for simplicity, however, they may be provided in any suitable manner known to the person skilled in the art.

The first and second TFTs 710, 760 may each be an n-type MOSFET (NMOS) or a p-type MOSFETs (PMOS), where the type of TFT is defined by the dominant charge carrier in their respective channel regions i.e. electrons for n-type and holes for p-type. As set out above with respect to FIGS. 1 to 6, the electrical properties of the semiconductor, such as metal oxide for instance, used to form the respective channels may be controlled using one or more techniques before, during or after deposition of the semiconductor material.

In order to increase the range of resistances that may be provided in a thin-film IC, the first and second resistors 730, 780 may be of different types. For example, the resistor body 736 of the first resistor 730 may be formed from a metal to form a relatively low-value resistor and the resistor body 786 of the second resistor 780 may be formed from a semiconductor or a semiconductor that may have has its electrical properties altered, for example using one of the techniques described above, in order to achieve a particular resistance that is higher than that of the first resistor 730. In this case, the resistor body 786 of the second resistor 780 may be formed of the same or corresponding material to the channel of one or more of the first TFT 710 and the second TFT 760. Alternatively, the channel 718 and resistor body 736 of first TFT/resistor pair 700 may be formed from a first material, and the channel 768 and the resistor body 786 of the second TFT/resistor pair 750 may be formed from a second material, where the portions of the materials forming the channels and resistor bodies may have had their electrical properties altered either during or after deposition in order to achieve the desired electrical properties.

In one example, both the first and second TFTs 710, 760 may be PMOS TFTs, such that their channels are formed from a p-type material and their resistor bodies of their respective resistors may be formed from the same material as the channels. However, the portion of the material forming each of the resistor bodies may have been deposited under different conditions or subsequently processed in order to control their electrical properties, in particular their resistances. For instance, the material forming the resistor body 736 of the first resistor 730 may have been deposited under conditions suitable for achieving a first resistance, and the resistor body 768 of the second resistor 780 may have been annealed in order to achieve a second resistance; however, it will be appreciated that any combination of techniques may be used to achieve the desired material properties and thus resistances.

In another approach, the first and second TFTs 710, 760 of FIG. 7 may be of different types, such that they form a complementary metal oxide semiconductor (CMOS) pair of TFTs and thus the thin-film IC that they form part of is a thin-film CMOS IC. For example, the first TFT 710 may be an n-type TFT and the second TFT 760 may be a p-type TFT, where the properties of the respective channels may be achieved via selection of an appropriate source semiconductor and/or any of the aforementioned techniques used to alter the electrical properties of the semiconductor(s) forming the respective channels.

Advantageously, when the two TFTs 710, 760 form part of a CMOS thin-film IC, the bodies of the first and second resistors 736, 786 may be formed from the materials that form the semiconductors having the different properties (i.e. n-type and p-type) used in each TFT. In turn this means that resistors of significantly different values may be fabricated in the same circuits as the TFTs, although not necessarily directly connected to the TFTs, where the shared material used to form each resistor may be chosen based on the resistor values required and the fabrication constraints of the materials. For example, if the first TFT 710 has an n-type channel, the same n-type material may be used as the body of the first resistor 730 in order to form a relatively low-value resistor. Correspondingly, if the second TFT 760 has a p-type channel, the same p-type material may be used as the body of the second resistor 780 in order to provide a relatively high-value resistor. Furthermore, the portions of the material forming each of the resistor bodies may also have the electrical properties altered using one or more of the techniques described above, so that although the TFT channels and resistor bodies may be formed from a same source semiconductor, their electrical properties may differ in order to provide the desired semiconductor and resistive characteristics. One example of a CMOS implementation of the TFT/resistors pairs of FIG. 7 may be achieved via the use of indium gallium zinc oxide (IGZO) for the n-type channel material and nickel oxide (NiO) used for the p-type material, where the IGZO may be used to provide a resistor with a resistance of below approximately 10 k$\Omega$/□ and the NiO may be used to provide a resistor with a resistance of above approximately 10 k$\Omega$/□. In other words, the channels of the TFTs and the resistor bodies of the resistors of FIG. 7 may be formed from at least one of a first source material and a second source material, where portions of one or more of the source materials may be altered either during or after deposition in order to achieve the desired electrical properties for the TFT channels and/or resistor bodies.

The production of thin-film CMOS ICs may require a relatively complex fabrication process including additional deposition steps compared to unipolar thin-film ICs, since different source materials e.g. different metal oxides, may be required to be deposited for each type of TFT and/or resistor. Consequently, a reduced complexity approach to the provision of a wide-range of resistor values in CMOS thin-film ICs is desirable.

In accordance with one example, a reduced complexity approach to the fabrication of a CMOS thin-film IC that may include an increased range of resistors can be achieved via the use of ambipolar materials such as metal oxides including SnO, $SnO_2$, CuO, $Cu_2O$, $CuO_2$ for example, whose electrical properties can be altered such that it can form n-type semiconductive, p-type semiconductive or conductive material dependent upon the processing that is applied to it. Advantageously, this means that a same material that may be deposited in a single deposition layer can be used to form the n-type TFTs, p-type TFTs, and resistors of higher and lower values.

For example, techniques such as that set out in "*Thin Film Complementary Metal Oxide Semiconductor (CMOS) Device Using a Single-Step Deposition of the Channel Layer*", Nayak et al, Sci. Rep. 4, 4672; DI:10.1038/srep04672 (2014) may provide lower complexity fabrication of thin-film CMOS TFTs. Consequently, the techniques set out above with respect to the efficient provision of a wider range of resistor values in a thin-film IC may be combined with approaches to efficiently provide thin-film CMOS ICs in order to achieve a thin-film CMOS IC that includes a wide range of resistor values in a space-efficient and relatively simple fabrication method.

Although FIG. 7 illustrates the two TFTs 710, 760 forming part of a CMOS thin-film IC positioned directly on the same substrate 790, other approaches are possible. For example, the complementary TFTs 710, 760 may be stacked vertically as described in GB2561004A. First and second resistors 730, 780 may be positioned at any desired levels in the IC structure and in some examples the resistor body composed of one material may be formed in the same layer as the TFT channel composed of the same or corresponding material.

Although FIG. 7 relates to a thin-film IC including two TFT/resistor pairs, any number of TFT/resistor pairs may be used, each with differing electrical properties. Furthermore, in addition to TFTs, any suitable semiconductor device may be used. For instance, in some examples, one or both of the TFTs of FIG. 7 may be replaced with a diode, such as a Schottky diode, where the semiconductor of the Schottky diode may be of a same type as the channel of the first TFT (unipolar) or of a different type as the channel of the first TFT (CMOS).

Figure 8:
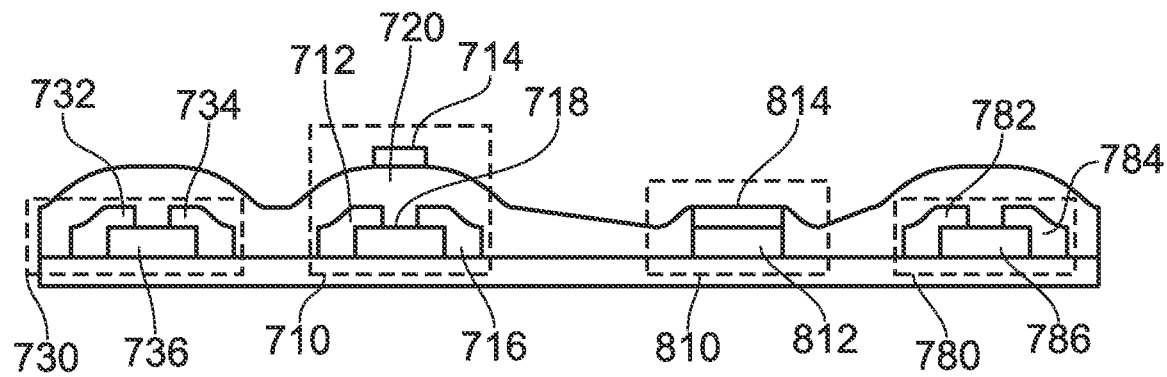
FIG. 8 provides a schematic diagram of a TFT/resistor pair and Schottky diode/resistor pair for providing an increased range of resistor values in a thin-film IC.

FIG. 8 illustrates a further example structure that may be included in a thin-film IC where an increased range of resistances are provided compared to conventional thin-film IC structures. In comparison with the structure of FIG. 7, the second TFT has been replaced with a Schottky diode 810 formed from a semiconductor layer 812 and a metal layer 814. The semiconductor layer 812 may be n-type or p-type and may be formed from the same or corresponding material to the resistor body of resistor 780 and or the first TFT 710 and the first resistor 730. In a similar manner to the TFT/resistor pairs of FIG. 7, the portions of the material forming the semiconductor region 812 of the Schottky diode 810 and that of the resistor body 786 may have their electrical properties altered in order to achieve a diode and/or resistor with the desired characteristics using any of the aforementioned approaches to alteration of the electrical properties of a semiconductor.

Although FIGS. 7 and 8 have been described with respect to TFTs and/or Schottky diodes, any type of two or three-terminal semiconductor device may be used, for example, the semiconductor devices of FIGS. 7 and 8 may be alternative types of diode or transistor. However, regardless of the specific type of semiconductor device, the principal of utilising different semiconductors or materials for forming the two resistors and/or processing a same semiconductor in different manners in order to alter the electrical properties of the material forming the resistor bodies may be applied, thus allowing an increased range of resistor values to be efficiently provided in a thin-film IC.

FIGS. 9a to 9h provide an example process for fabricating a similar thin-film IC similar to that illustrated in FIG. 7 containing two TFT/resistor pairs, where the pairs are based on different types of semiconductor or a same semiconductor whose electrical properties have been appropriately altered. For example, the first TFT/resistor pair may be based on an n-type semiconductor such as IGZO, and the second pair may be based on a p-type semiconductor such as NiO, such that the IC is a thin-film CMOS IC. Furthermore, the values of the resistors may differ significantly depending on the materials and/or processing of the materials used to form the bodies of the resistors, thus enabling a wide range of resistors to be efficiently provided in terms of fabrication complexity and footprint size.

Figure 9A:
FIGS. 9a-9k provide an example fabrication process for fabricating two TFT/resistors pairs in a thin-film IC.

Firstly, in FIG. 9a a layer 904 of a first semiconducting source material is deposited on a substrate 902, where the first source material may be an n-type semiconductor, a p-type semiconductor, an intrinsic semiconductor (i.e. neither n-type or p-type), or an ambipolar material. The first source material may be deposited under certain conditions in order to alter the electrical properties of the first source material during deposition or its electrical properties may be altered after deposition via annealing, exposure to electromagnetic radiation, or doping of the substrate or other neighbouring materials.

Figure 9B:
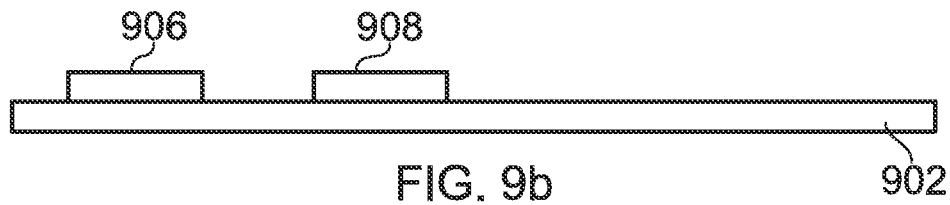

After the source material 904 has been deposited on the substrate, the source material is then patterned (e.g. masked and etched) to form the resistor body 906 and the TFT channel 908 as shown by FIG. 9b. Further processing of the resistor body 906 and the TFT channel 908 may alternatively or additionally take place at this stage in order to appropriately alter the electrical properties of these portions of the source material in order to achieve the electrical properties necessary for forming the TFT channel and the resistor body.

Figure 9C:
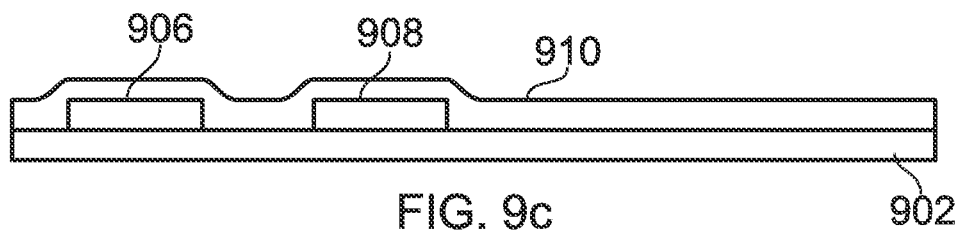

In FIG. 9c, a layer of conductive material 910, such as a metal for example is deposited on the substrate 904, the resistor body 906 and the TFT channel 908, for forming at least some of the contacts/terminals of the TFTs and resistors.

Figure 9D:
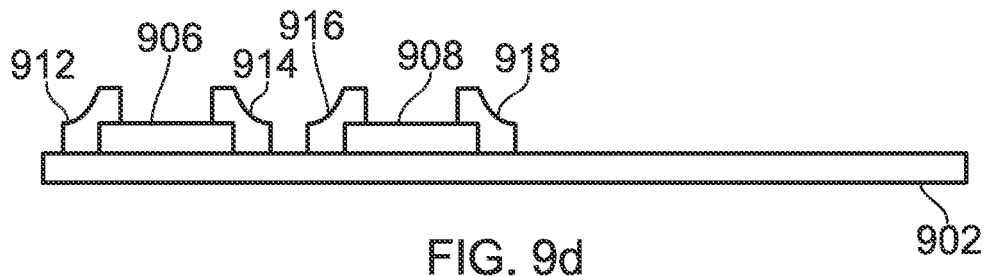

In FIG. 9d the contacts/terminals formed once the conductive layer has been patterned are shown. In particular, the first terminal 912 and the second terminal 914 of the resistor; and the source terminal 916 and the drain terminal 918 of the TFT have been formed.

Figure 9E:
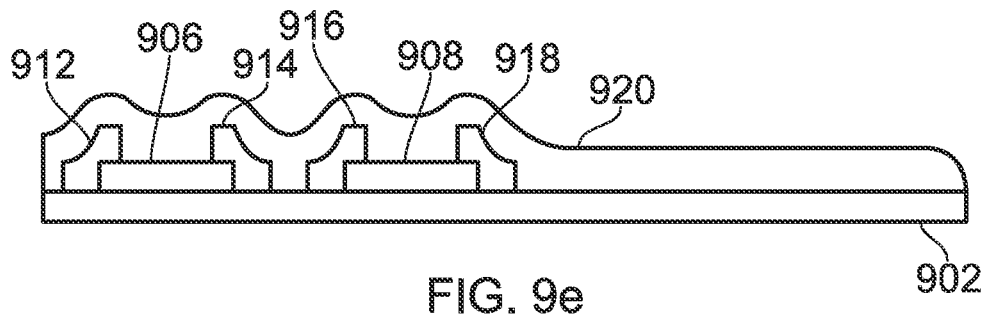

In FIG. 9e a layer of dielectric 920 is deposited over the substrate and the structures thereon to insulate the resistor and form the gate dielectric of the first TFT.

Figure 9F:
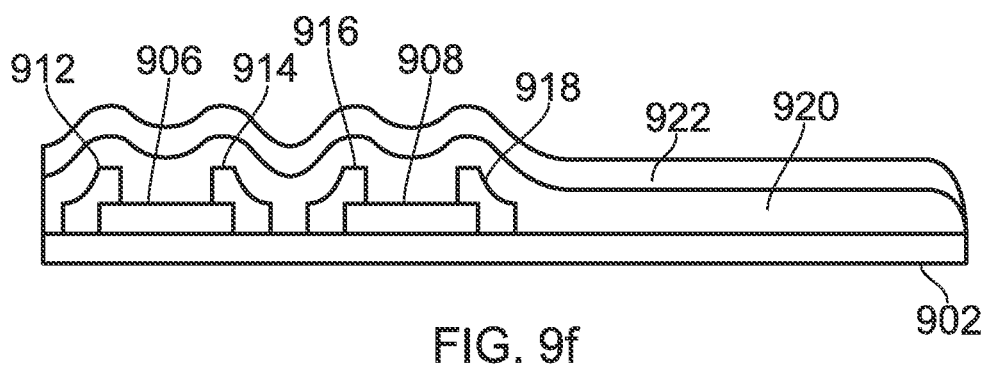

In FIG. 9f, a layer of a second source material 922 is deposited over the substrate and the structures thereon, where the second source material may be an n-type semiconductor, a p-type semiconductor, or an intrinsic semiconductor. As for the first source material, the second source material may be deposited under certain conditions in order to alter the electrical properties of the second source material during deposition or its electrical properties may be altered after deposition via annealing, exposure electromagnetic radiation, or doping of the substrate or other neighbouring materials.

Figure 9G:
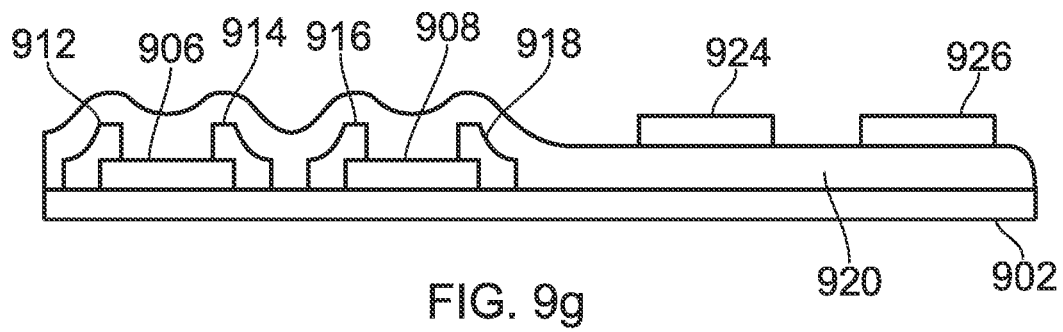

In FIG. 9g the layer of second semiconducting source material 922 has been patterned to form the channel 924 of the second TFT and the resistor body 926 of the second resistor. Although it has been described that the alteration of the electrical properties of the second source material may take place during or after the deposition of the second material, it may also take place after the TFT channel 924 and the resistor body 926 have been patterned, in a similar manner to that described with reference to FIG. 5*a*.

Figure 9H:
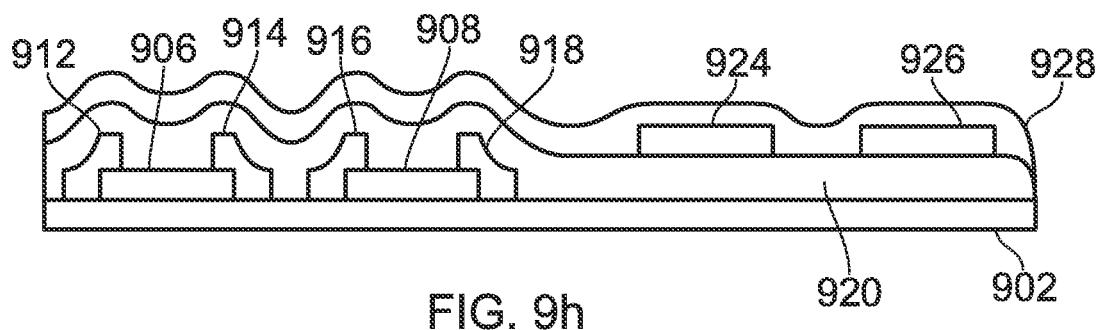

In FIG. 9*h*, a second layer of conductive material 928, such as a metal for example, for forming at least some of the contacts/terminals of the second TFT and second resistor is deposited.

Figure 9I:
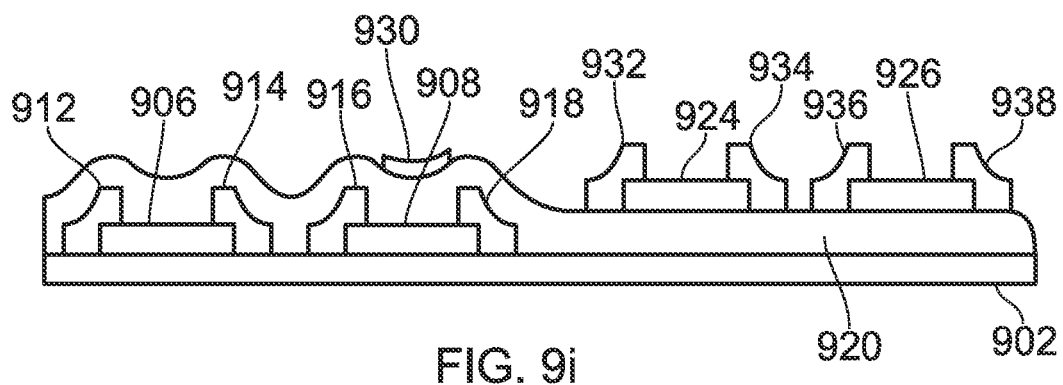

In FIG. 9*i* the contacts/terminals formed once the conductive layer 928 has been patterned are shown. In particular, the gate terminal 930 of the first TFT; the source terminal 932 and the drain terminal 934 of the second TFT; and the first terminal 936 and the second terminal 938 of the second resistor have been formed.

Figure 9J:
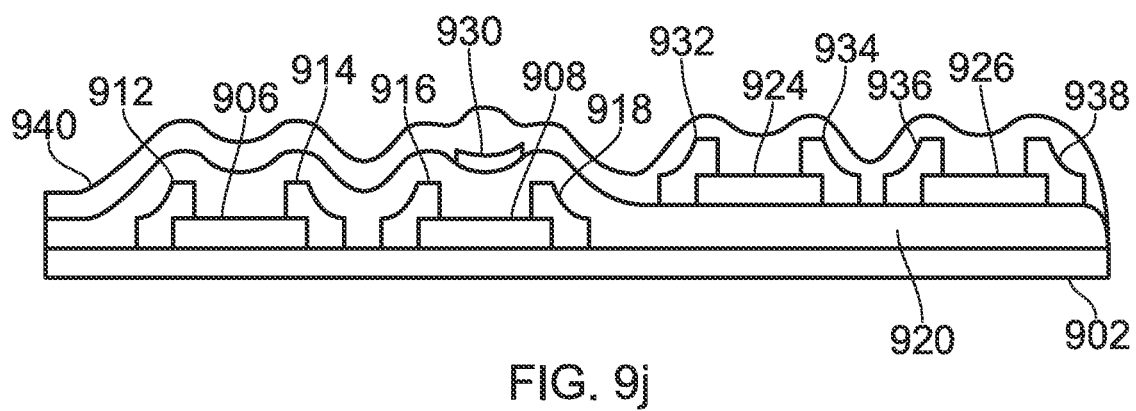

In FIG. 9*j*, after formation of the terminals, a second layer of dielectric 940 is deposited over the substrate and the structures thereon to insulate the resistor and form the gate dielectric of the second TFT.

Figure 9K:
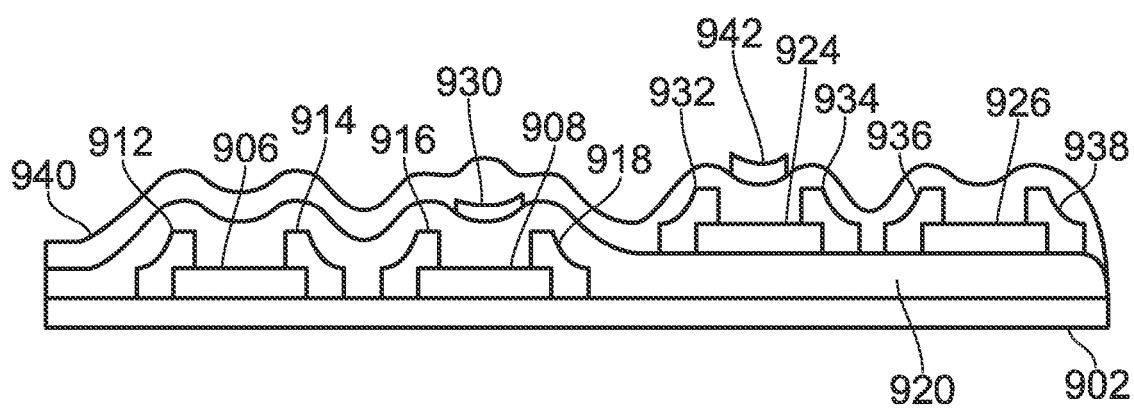

Lastly, in FIG. 9*k* the gate terminal 942 of the second TFT has been formed on the gate dielectric, via the deposition and patterning of a second layer of conductive material.

By following the fabrication process of FIG. 9, both unipolar and CMOS thin-film ICs with an increased range of resistor values may be achieved.

Although FIG. 9 has been mainly been described with respect to using different source semiconducting materials for the two TFT/resistor pairs, as discussed above, a same source material may be used for both TFT/resistor pairs, with appropriate processing or doping of neighbouring materials used to appropriately alter the electrical properties of the various portions of semiconductor that form the semiconductor devices, thus potentially leading to a lower complexity approach to fabricating thin-film ICs with an increased range of resistor values.

FIG. 10 provides another example process for fabricating two TFT/resistors pairs in a thin-film IC but where, in contrast to FIG. 9, the source material used to form the devices is deposited as a single deposition layer and the properties of the material are altered by an appropriately chosen material that neighbours the respective portion of the deposition layer, for example a material that has been appropriately doped for instance.

Figure 10A:
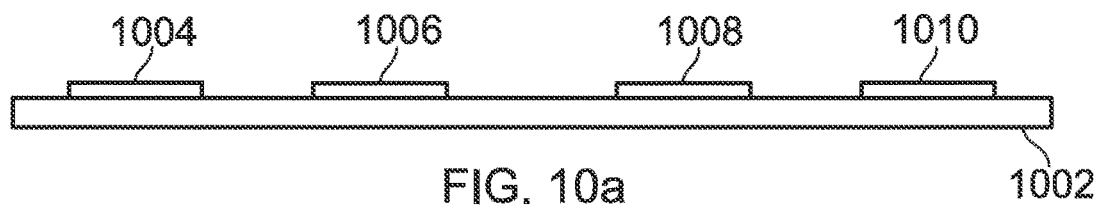
FIGS. 10a-10g provide an example fabrication process for fabricating two TFT/resistors pairs in a thin-film IC.

Firstly, in FIG. 10*a* portions of materials intended to interact with a semiconductor layer used to form the TFT channels and resistor bodies are formed on the substrate 1002. Each of the portions 1004, 1006, 1008, and 1010 may be formed from the same or different materials depending the electrical properties of the TFTs channels and resistor bodies required. Portions 1004-1010 may be formed in any suitable manner, for example via the use of lithographic patterning for example. In other examples one or more of the portions 1004, 1006, 1008 and 1010 may not be required.

Figure 10B:
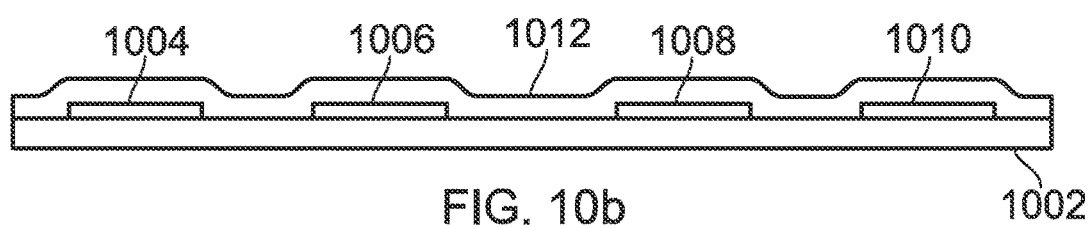

In FIG. 10*b* a layer of a source semiconductor 1012 has been deposited over the portions 1004-1010. Although an identical source semiconductor has been deposited to form the TFTs channels and the resistor bodies, the electrical properties of the regions of the semiconductor surrounding portions 1004-1010 may be altered via the interaction of the semiconductor with each of the portions 1004-1010. For example, the semiconductor region surrounding the portion 1004 may be altered to be achieve a first resistance, the semiconductor region surrounding the portion 1006 may be altered to be an n-type semiconductor, the semiconductor region surrounding the portion 1008 may be altered to be a p-type semiconductor, the semiconductor region surrounding the portion 1010 may be altered to become resistive and thus achieve a second resistance.

Figure 10C:
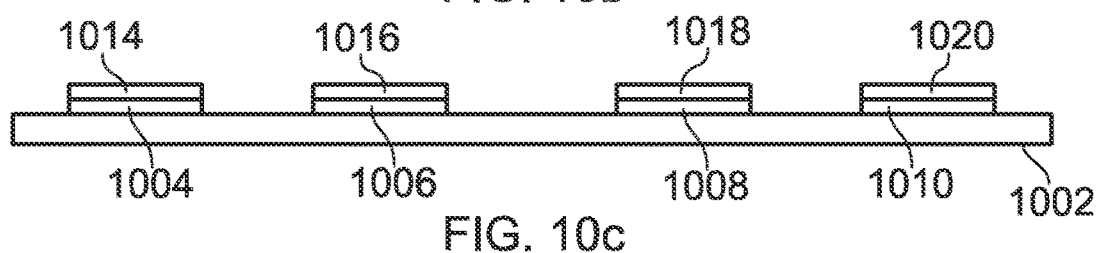

In FIG. 10*c* the deposited semiconductor layer 1012 has been patterned to form a resistor body 1014 of a first resistor, a channel 1016 of a first TFT, a channel 1018 of a second TFT, and a resistor body 1020 of a second resistor.

Figure 10D:
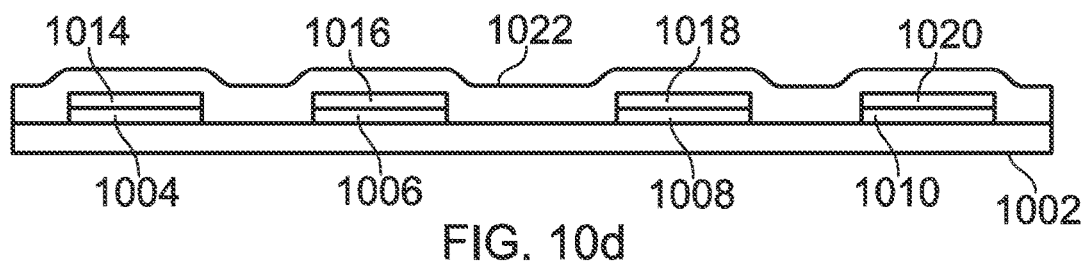

In FIG. 10*d* a layer of conductive material 1022, such as a metal for example, for forming at least some of the contacts/terminals of the TFTs and resistors is deposited.

Figure 10E:
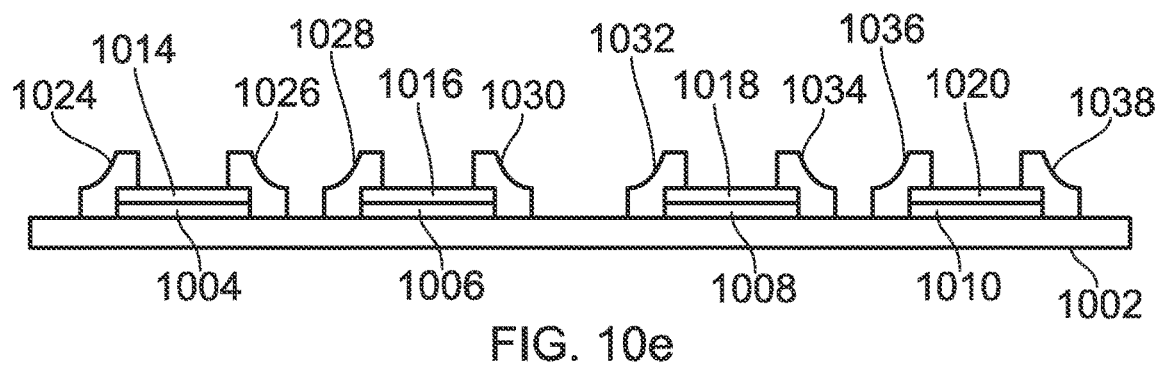

In FIG. 10*e* the contacts/terminals have been formed once the conductive layer 1022 has been patterned. In particular, the first terminal 1024 and the second terminal 1026 of the first resistor; the source terminal 1028 and the drain terminal 1030 of the first TFT; the source terminal 1032 and the drain terminal 1034 of the second TFT; and the first terminal 1036 and the second terminal 1038 of the second resistor have been formed.

Figure 10F:
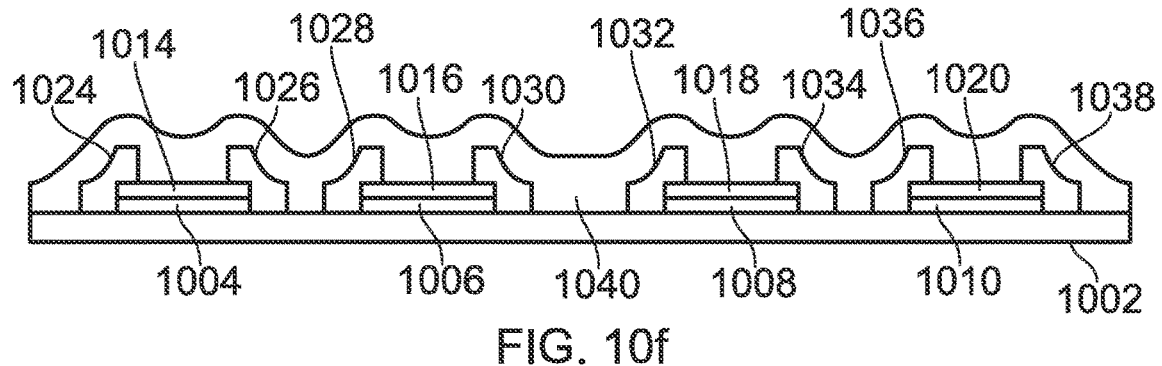

In FIG. 10*f*, after formation of the terminals, a layer of dielectric 1040 is deposited over the substrate and the structures thereon to insulate the resistor and form the gate dielectric of the first and second TFTs.

Figure 10G:
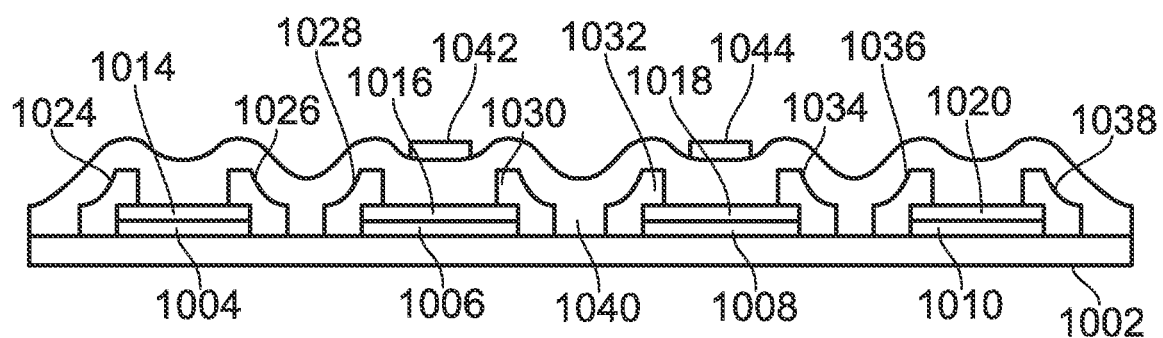

Lastly, in FIG. 10*g* the gate terminal 1042 of the first TFT and the gate terminal 1044 of the second TFT have been formed on the respective gate dielectrics, via the deposition and patterning of a second layer of conductive material.

Although FIG. 10 relates the alteration of the electrical properties of the source semiconductor material used to form the resistor bodies and semiconducting regions of the TFTs via the interaction with neighbouring materials that has been deposited prior to the source materials, a number of other approaches may be taken. For example, the underlying substrate may be appropriately doped in order to alter the electrical characteristics of the deposited source materials. Alternatively, after deposition of the source materials, the portions forming each device may be annealed, selectively exposed to electromagnetic radiation (e.g. ultraviolet light) or another form of radiation, or otherwise processed in order to appropriately alter their electrical properties.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A thin-film integrated circuit, IC, comprising:
a first semiconductor device,
a second semiconductor device,
a first resistor, and
a second resistor, wherein a semiconducting region of the first semiconductor device, a resistor body of the first resistor, a semiconducting region of the second semiconductor device, and a resistor body of the second resistor are formed from at least one of a first source material and a second source material, wherein a material of the resistor body of the first resistor and a material of the resistor body of the second resistor have different electrical properties, and wherein the first semiconductor device is a first thin-film transistor, TFT, or a Schottky diode, and the resistor body of the first resistor and the channel of the first TFT or the semiconducting region of the Schottky diode are formed from a single deposition layer of the first source material.

2. The thin-film IC of claim 1, wherein the semiconducting region of the first semiconductor device and the resistor body of the first resistor are formed from the first source material, and the semiconducting region of the second semiconductor device and the resistor body of the second resistor are formed from the second source material.

3. The thin-film IC of claim 1, wherein at least one of the resistor body of the first resistor and the semiconducting region of the first semiconductor device, and the second material that forms the resistor body of the second resistor and the semiconducting region of the second semiconductor device are included in a single deposition layer.

4. The thin-film IC of claim 1, wherein the second semiconductor device is a second thin-film transistor, TFT, and the resistor body of the second resistor and the channel of the second TFT are formed from the second source material.

5. The thin-film IC of claim 1, wherein the second semiconductor device is a second Schottky diode and the resistor body of the second resistor and a semiconducting region of the second Schottky diode are formed from the second source material.

6. The thin-film IC of claim 1, where a material of the semiconducting region of the first semiconductor device and the material of the resistor body of the first resistor have different electrical properties.

7. The thin-film IC of claim 1, wherein the first source material and the second source material are semiconductors.

8. The thin-film IC of claim 1, wherein the first source material is an n-type semiconductor and the second source material is a p-type semiconductor.

9. The thin-film IC of claim 1, wherein the first and second source materials are the same or different.

10. The thin-film IC of claim 9, wherein the first and second source materials are an intrinsic semiconductor.

11. The thin-film IC of claim 4, wherein the first TFT is an n-type TFT and the second TFT is a p-type TFT.

12. A method for fabricating a thin-film integrated circuit, IC, the thin-film IC comprising a first semiconductor device, a second semiconductor device, a first resistor, and a second resistor, and the method comprising depositing at least one of a first source material and a second source material to form a semiconducting region of the first semiconductor device, a resistor body of the first resistor, a semiconducting region of the second semiconductor device, and a resistor body of the second resistor, and altering the electrical properties of at least one portion of the source material forming the semiconducting region of the first semiconductor device, the resistor body of the first resistor, the semiconducting region of the second semiconductor device, and the resistor body of the second resistor during or after deposition of the respective portion of source material, wherein the disposed material of the resistor body of the first resistor and the disposed material of the resistor body of the second resistor have different electrical properties, and wherein the first semiconductor device is a first thin-film transistor, TFT, or a Schottky diode, and the resistor body of the first resistor and the channel of the first TFT or the semiconducting region of the Schottky diode are formed from a single deposition layer of the first source material.

13. The method of claim 12, wherein the depositing at least one of a first source material and a second source material comprises:

depositing a layer of the first source material to form the semiconducting region of the first semiconductor device and the resistor body of the first resistor, and depositing a layer of the second source material to form the semiconducting region of the second semiconductor device and the resistor body of the second resistor.

14. The method of claim 12, wherein altering the electrical properties comprises at least one of controlling the environmental conditions under which the respective portion of the source material is deposited, depositing a further material onto the respective portion of source material, exposing the respective portion of the source material to electromagnetic radiation, and controlling the electrical properties of a surface onto which the respective portion of source material is deposited.

15. The method of claim 12, wherein altering the electrical properties of a portion of the source material includes one or more of changing the source material of the portion from an n-type semiconductor to a p-type semiconductor, changing the source material of the portion from a p-type semiconductor to an n-type semiconductor, changing the source material of the portion from an intrinsic semiconductor to an n-type or a p-type semiconductor, and changing the source material of the portion from a semiconductor to a conductor.

16. The method of claim 12, wherein the second semiconductor device is a second thin-film transistor, TFT, and the resistor body of the second resistor and the channel of the second TFT are formed from the second source material.

17. The method of claim 12, wherein the second semiconductor device is a second Schottky diode and the resistor body of the second resistor and a semiconducting region of the second Schottky diode are formed from the second source material.

18. The method of claim 12, where the material of the semiconducting region of the first semiconductor device and the material of the resistor body of the first resistor have different electrical properties.

19. The thin-film IC of claim 1, wherein there is a difference of at least an order of magnitude between the resistivity the material of the resistor body of the first resistor and the resistivity of the material of the resistor body of the second resistor.

20. The thin-film IC of claim 1, wherein the first and second source materials are metal oxides.

* * * * *